United States Patent
Daubenspeck et al.

(10) Patent No.: US 9,165,831 B2
(45) Date of Patent: Oct. 20, 2015

(54) DICE BEFORE GRIND WITH BACKSIDE METAL

(71) Applicant: International Business Machines Corporation, Armonk, NY (US)

(72) Inventors: Timothy H. Daubenspeck, Colchester, VT (US); Jeffrey P. Gambino, Westford, VT (US); Charles F. Musante, Burlington, VT (US); Christopher D. Muzzy, Burlington, VT (US); Wolfgang Sauter, Richmond, VT (US); Timothy D. Sullivan, Underhill, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 40 days.

(21) Appl. No.: 13/928,676

(22) Filed: Jun. 27, 2013

(65) Prior Publication Data

US 2015/0001683 A1   Jan. 1, 2015

(51) Int. Cl.
*H01L 21/78*     (2006.01)
*H01L 21/283*    (2006.01)

(52) U.S. Cl.
CPC .............. *H01L 21/78* (2013.01); *H01L 21/283* (2013.01)

(58) Field of Classification Search
CPC ................ H01L 2924/00; H01L 21/78; H01L 2221/68327
USPC .................. 257/E21.599; 438/113, 460, 458
See application file for complete search history.

(56) References Cited

U.S. PATENT DOCUMENTS

| | | | |
|---|---|---|---|
| 5,071,792 A | 12/1991 | Van Vonno et al. | |
| 5,273,940 A | 12/1993 | Sanders | |
| 5,275,958 A | 1/1994 | Ishikawa | |
| 5,302,554 A * | 4/1994 | Kashiwa et al. | 438/17 |
| 5,324,687 A | 6/1994 | Wojnarowski | |
| 6,083,811 A | 7/2000 | Riding et al. | |
| 7,112,470 B2 | 9/2006 | Daubenspeck et al. | |
| 7,655,539 B2 * | 2/2010 | Hendricks et al. | 438/460 |
| 8,173,245 B2 | 5/2012 | Montgomery | |
| 2007/0087524 A1 * | 4/2007 | Montgomery | 438/427 |
| 2008/0213976 A1 * | 9/2008 | Farnworth | 438/460 |
| 2010/0081257 A1 | 4/2010 | Hendricks et al. | |
| 2010/0261335 A1 * | 10/2010 | Andry et al. | 438/462 |
| 2013/0127044 A1 * | 5/2013 | Poddar et al. | 257/737 |
| 2013/0280888 A1 * | 10/2013 | Stranzl et al. | 438/462 |

OTHER PUBLICATIONS

Stamper et al., "Through Wafer Via Integration in CMOS and BiCMOS Technologies", IBM Microelectronics.
Malladi et al., "3D Integration Techniques Applied to SiGe Power Amplifiers", ECS Transactions, 16 (10), pp. 1053-1067, (2008).

* cited by examiner

*Primary Examiner* — David Vu
*Assistant Examiner* — Jonathan Han
(74) *Attorney, Agent, or Firm* — Gibb & Riley, LLC; Anthony Canale

(57) ABSTRACT

A method including forming a plurality of dicing channels in a front side of a wafer; the plurality of dicing channels including a depth at least greater than a desired final thickness of the wafer, filling the plurality of dicing channels with a fill material and removing a portion of the wafer from a back side of the wafer until the desired final thickness is achieved, where a portion of the fill material within the plurality of dicing channel is exposed. The method further including depositing a metal layer on the back side of the wafer; removing the fill material from within the plurality of dicing channels to expose the metal layer at a bottom of the plurality of dicing channels, and removing a portion of the metal layer located at the bottom of the plurality of dicing channels.

15 Claims, 12 Drawing Sheets

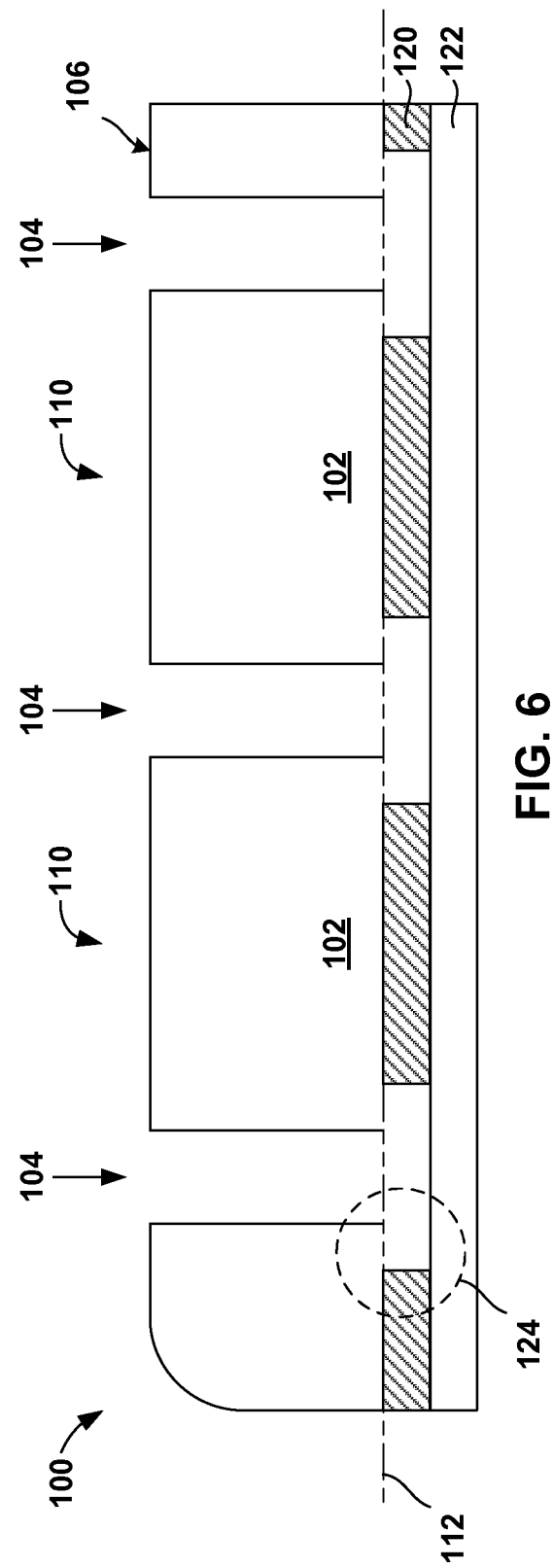

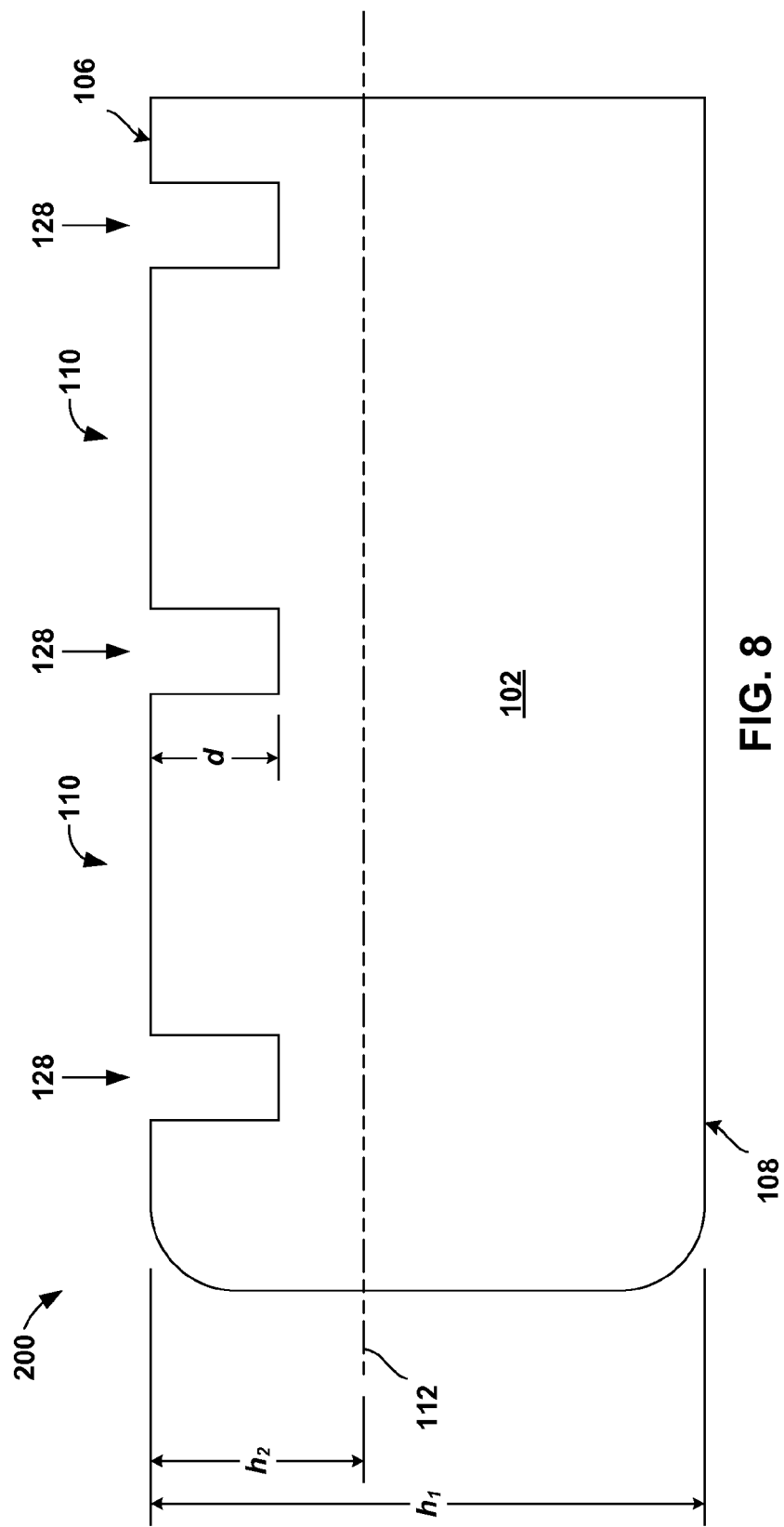

DICE BEFORE GRIND WITH BACKSIDE METAL

BACKGROUND

The present invention generally relates to semiconductor device manufacturing, and more particularly to chip dicing before backside grinding with the addition of a backside metal.

Chip dicing is the process of dividing a wafer into multiple individual chips. Typically, chip dicing involves the use of a saw blade, chemicals, a laser, or their combination to cut through and along kerf regions that run between multiple chips arranged on the wafer. The wafer may be diced using a standard dicing technique or a dice-before-grind (DBG) technique, as described in brief below. The standard dicing technique may involve dicing through the entire thickness of a wafer which has previously been ground to a desired final thickness. The dice-before-grind technique typically involves forming shallow dicing channels in a full-thickness wafer before being thinned.

SUMMARY

According to one embodiment of the present invention, a method is provided. The method may include forming a plurality of dicing channels in a front side of a wafer, the plurality of dicing channels including a depth at least greater than a desired final thickness of the wafer; filling the plurality of dicing channels with a fill material; and removing a portion of the wafer from a back side of the wafer until the desired final thickness is achieved, where a portion of the fill material within the plurality of dicing channel is exposed. The method further including depositing a metal layer on the back side of the wafer; removing the fill material from within the plurality of dicing channels to expose the metal layer at a bottom of the plurality of dicing channels; and removing a portion of the metal layer located at the bottom of the plurality of dicing channels.

According to another embodiment of the present invention, a method is provided. The method may include forming a plurality of dicing channels in a front side of a wafer; the plurality of dicing channels comprising a depth at least less than a desired final thickness of the wafer; removing a portion of the wafer from a back side of the wafer until the desired final thickness is achieved; and depositing a metal layer on the back side of the wafer. The method may further include etching a bottom of the plurality of dicing channels to expose the metal layer; and removing a portion of the metal layer located at the bottom of the plurality of dicing channels.

According to another embodiment, a structure is provided. The structure may include a chip diced from a wafer; and a metal layer located on a back side of the chip, wherein the edges of the metal layer are offset from the edges of the chip, the edges of the chip being perpendicular to the back side of the chip.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIGS. 1-7 illustrate the steps of a method of dicing a wafer according to an exemplary embodiment.

FIG. 2 is a cross section view of FIG. 1A, along section line A-A, illustrating the formation of a plurality of dicing channels according to an exemplary embodiment.

FIG. 3 is a cross section view of FIG. 1A, along section line A-A, illustrating the filling the plurality of dicing channels with a fill material according to an exemplary embodiment.

FIG. 4 is a cross section view of FIG. 1A, along section line A-A, illustrating the attachment of a handler followed by a backside grinding technique according to an exemplary embodiment.

FIG. 5 is a cross section view of FIG. 1A, along section line A-A, illustrating the deposition of a metal layer followed by the application of a backside tape, and the subsequent removal of the handler according to an exemplary embodiment.

FIG. 6 is a cross section view of FIG. 1A, along section line A-A, illustrating the removal of the fill material from within the plurality of dicing channels and the removal of a portion of the metal layer exposed at a bottom of the plurality of dicing channels according to an exemplary embodiment.

FIGS. 8-13 illustrate the steps of a method of dicing a wafer according to another exemplary embodiment.

FIG. 8 is a cross section view of FIG. 1A, along section line A-A, illustrating the formation of a plurality of dicing channels according to an exemplary embodiment.

FIG. 9 is a cross section view of FIG. 1A, along section line A-A, illustrating the attachment of a handler followed by a backside grinding technique according to an exemplary embodiment.

FIG. 10 is a cross section view of FIG. 1A, along section line A-A, illustrating the deposition of the metal layer followed by the application of a backside tape, and the subsequent removal of the handler according to an exemplary embodiment.

FIG. 11 is a cross section view of FIG. 1A, along section line A-A, illustrating etching of the plurality of dicing channels to expose the metal layer and the subsequent removal of a portion of the metal layer exposed at a bottom of the plurality of dicing channels according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
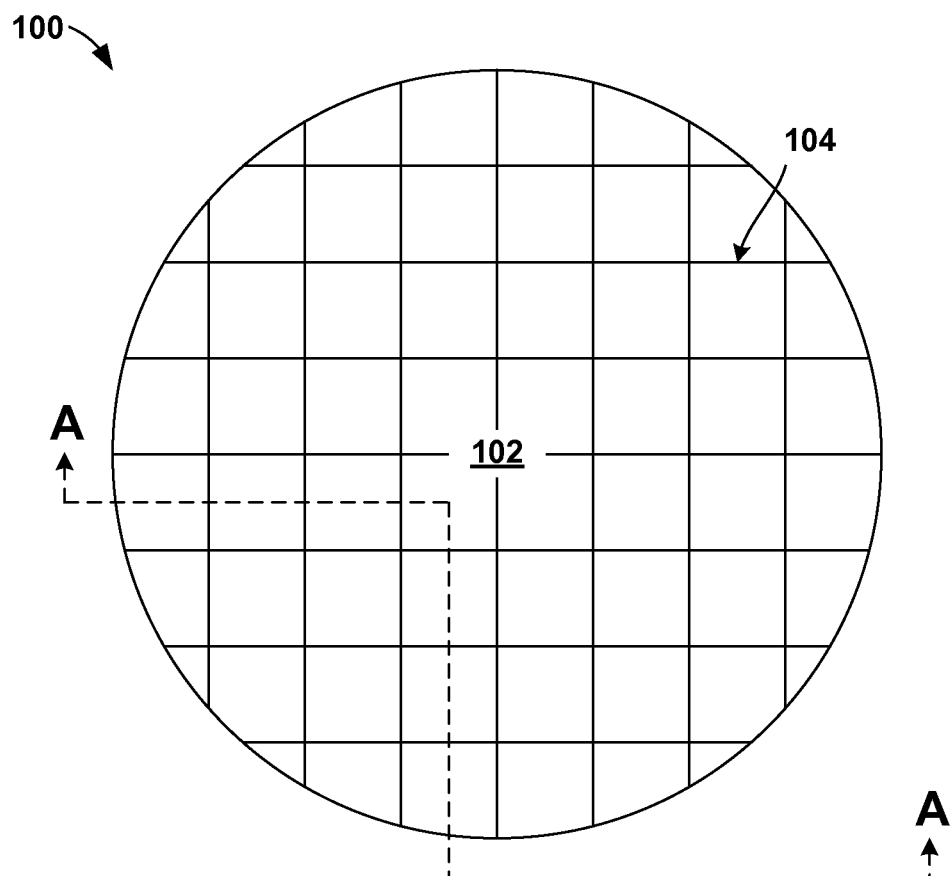
FIG. 1A is a top view of a structure illustrating a plurality of dicing channels in a wafer according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The embodiments of the present invention generally relate to semiconductor device manufacturing, and more particularly to chip dicing before backside grinding with the addition of a backside metal. In one embodiment, a wafer may undergo a partial dicing technique followed by the deposition of a metal layer on a back side of the wafer.

A metal layer may be deposited on the back side of the wafer, for example, to create a ground plane. During typical dice-before-grind techniques the metal layer may be contaminated by being exposed to an adhesive used to attach a handler. The adhesive may outgas during processing and affect metal adhesion, which may ultimately affect chip yield and performance. Ideally, adding the metal layer without the risk of contamination is preferable. One way to incorporate the metal layer into current dice-before-grind process flows may include filling a plurality of dicing channels with a fill material used to prevent contamination of the metal layer by the adhesive. An embodiment by which to add the metal layer and fill the plurality of dicing channels with the fill material is described in detail below by referring to the accompanying drawings FIGS. 1-7. In the present embodiment, the dicing channels are formed to a depth greater than a desired final thickness of the wafer after being thinned. More, specifically, the fill material within the plurality of dicing channels may be in direct contact with the metal layer, and physically separate the metal layer from the adhesive.

Figure 1B:
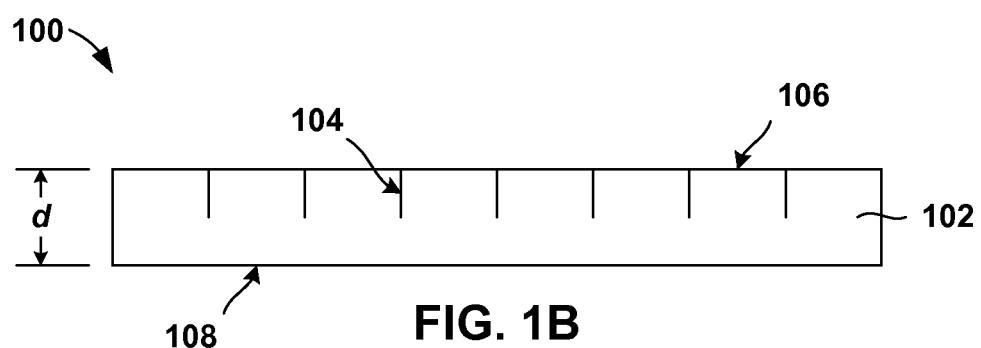
FIG. 1B is a side view of FIG. 1A according to an exemplary embodiment.

Referring now to FIGS. 1A and 1B, a structure 100 is shown. The structure 100 may include a wafer 102 having a plurality of dicing channels 104. The wafer may 102 may also include a front side 106 and a back side 108. The front side 106 of the wafer 102 may also be referred to as the top side or the device side. The plurality of dicing channels 104 may be formed using any wafer dicing technique known in the art. The chosen dicing technique may include the use of a saw, a laser, chemicals or some combination thereof. In one embodiment, the plurality of dicing channels 104 may have a depth less than the total thickness of the wafer 102 at the present stage before dicing, as described below. For example, a 200 mm diameter silicon wafer may have a thickness ranging from about 705 μm to about 745 μm before backside grinding, and a thickness of about 50 μm to about 200 μm after backside grinding. It should be well understood by a person of ordinary skill in the art that the number and placement of the dicing channels 104 may depend on the placement and size of individual chips formed on the wafer 102. FIGS. 2-7 each represent a cross section view of FIG. 1A along section line A-A.

The wafer may include a typical wafer known in the art of which may include multiple layers and materials. The multiple layers may consist of semiconductor materials, dielectric materials, and conductive materials. The semiconductor materials may include any semiconductor materials well known in the art, such as, for example, undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Non-limiting examples of compound semiconductor materials include gallium arsenide, indium arsenide, and indium phosphide. Typically the wafer 102 may be about, but is not limited to, several hundred microns thick, as described above.

The dielectric materials may include any of several dielectric materials, for example, oxides, nitrides and oxynitrides of silicon. The dielectric material may also include oxides, nitrides and oxynitrides of elements other than silicon. In addition, the dielectric materials may include crystalline or non-crystalline dielectric material. The conductive materials may include any of several widely used materials, such as, for example, copper, tungsten, and aluminum.

Figure 2:
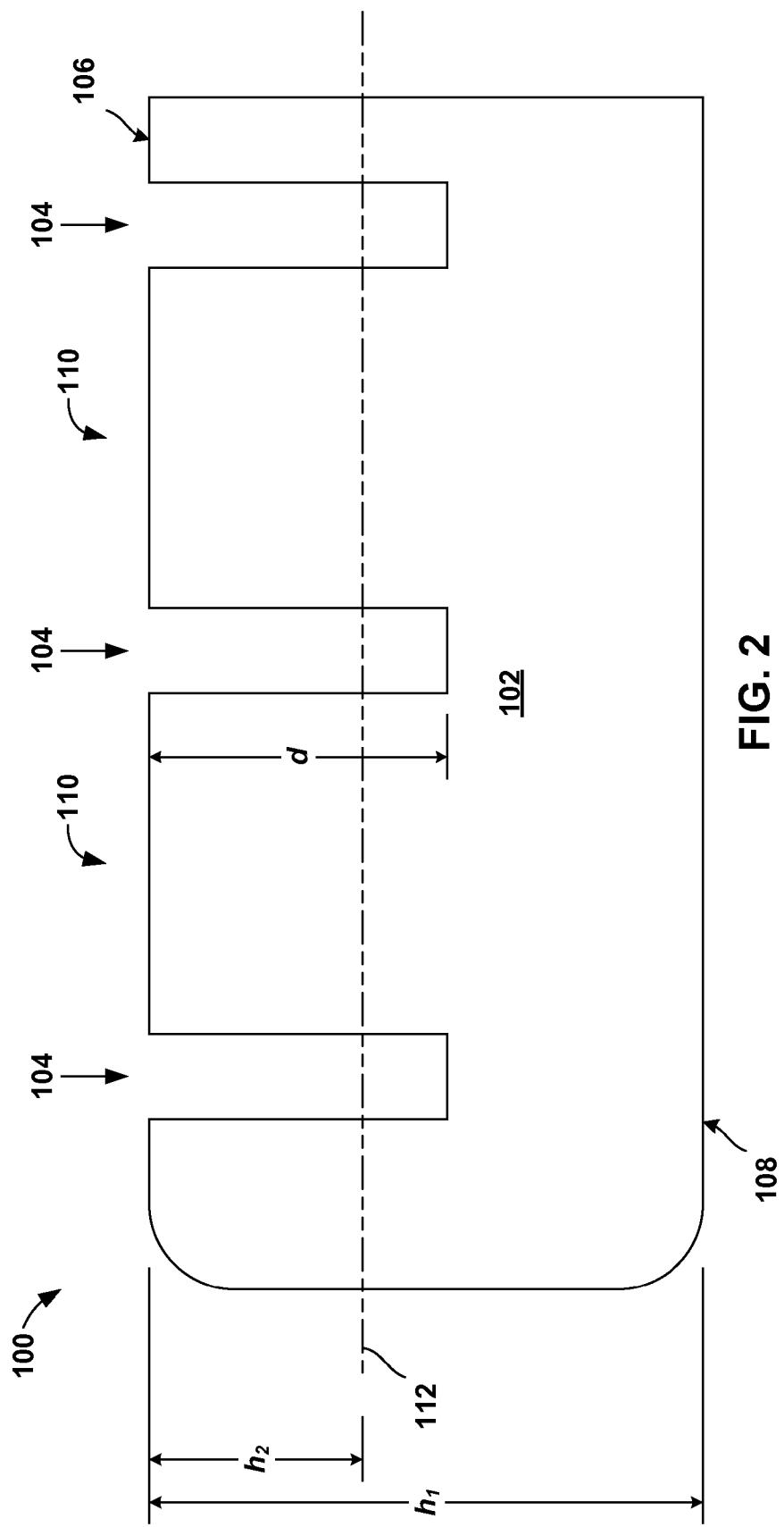

Referring now to FIG. 2, the plurality of dicing channels 104 illustrated in the present figure separate one or more chips, for example the chips 110. In one embodiment, the wafer 102 may have a total thickness ($h_1$) ranging from about 705 μm to about 745 μm, and a desired final thickness ($h_2$) ranging from about 90 μm to about 110 μm, the total thickness ($h_1$) may be measured before backside grinding and the desired final thickness ($h_2$) may be measured after backside grinding. The desired final thickness ($h_2$) may be indicated in the figures by a reference plane 112. The wafer 102 may undergo a subsequent backside grinding technique, described in detail below, in which a portion of the back side 108 of the wafer 102 is removed up to the reference plane 112 resulting in the wafer 102 having the desired final thickness ($h_2$). The dicing channels 104 may extend from the front side 106 of the wafer 102 to a depth below the reference plane 112, or to a depth greater than the desired final thickness ($h_2$). In the present example, the plurality of dicing channels for a wafer with a desired final thickness of 100 μm, may have a depth (d) ranging from about 110 μm to about 150 μm. The dicing channels 104 may preferably be formed to ultimately divide the wafer 102 into individual chips or die. The above dicing technique may also be referred to as a partial dicing technique because the dicing channels do not extend through the total thickness ($h_1$) of the wafer 102.

Figure 3:
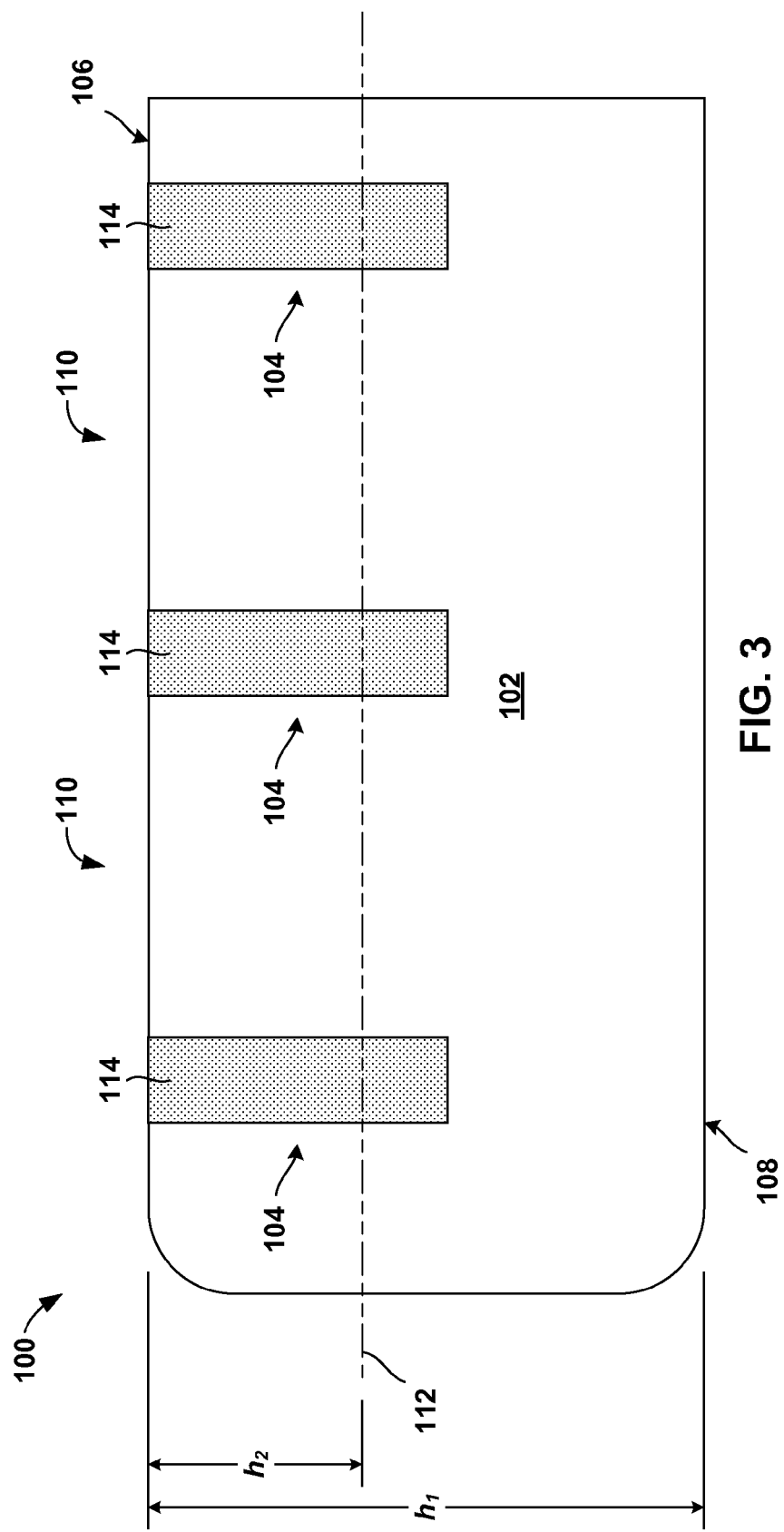

Referring now to FIG. 3, a fill material 114 may be deposited within the plurality of dicing channels 104. The fill material 114 may include any compatible inorganic material and may be deposited using any known method. A compatible inorganic material may be removable selective to the wafer material. In one embodiment, the fill material 114 may include a spin-on material such as, for example, silicon, germanium, or spin-on glass. The fill material 114 may preferably be compatible with any photosensitive soft passivation layer (for example, photosensitive polyimide, PSPI) typically used in known dicing techniques. The fill material 114 may preferably prevent the plurality of dicing channels 104 from being filled with an adhesive used in subsequent steps. In one embodiment, one or more masking layers (not shown) may be deposited above the structure 100 to protect features of the chips 110, for example, bond pads (not shown) located on the surface of the chips 110, and which may be susceptible to damage during fabrication. Protecting features of the chips is a well known step of typical dicing techniques. Bond pads may include, for example, aluminum or copper pads located on the front side of an individual chip (e.g. 110), and may be used to make electrical connections to the chip or used to join two chips stacked vertically.

Figure 4:
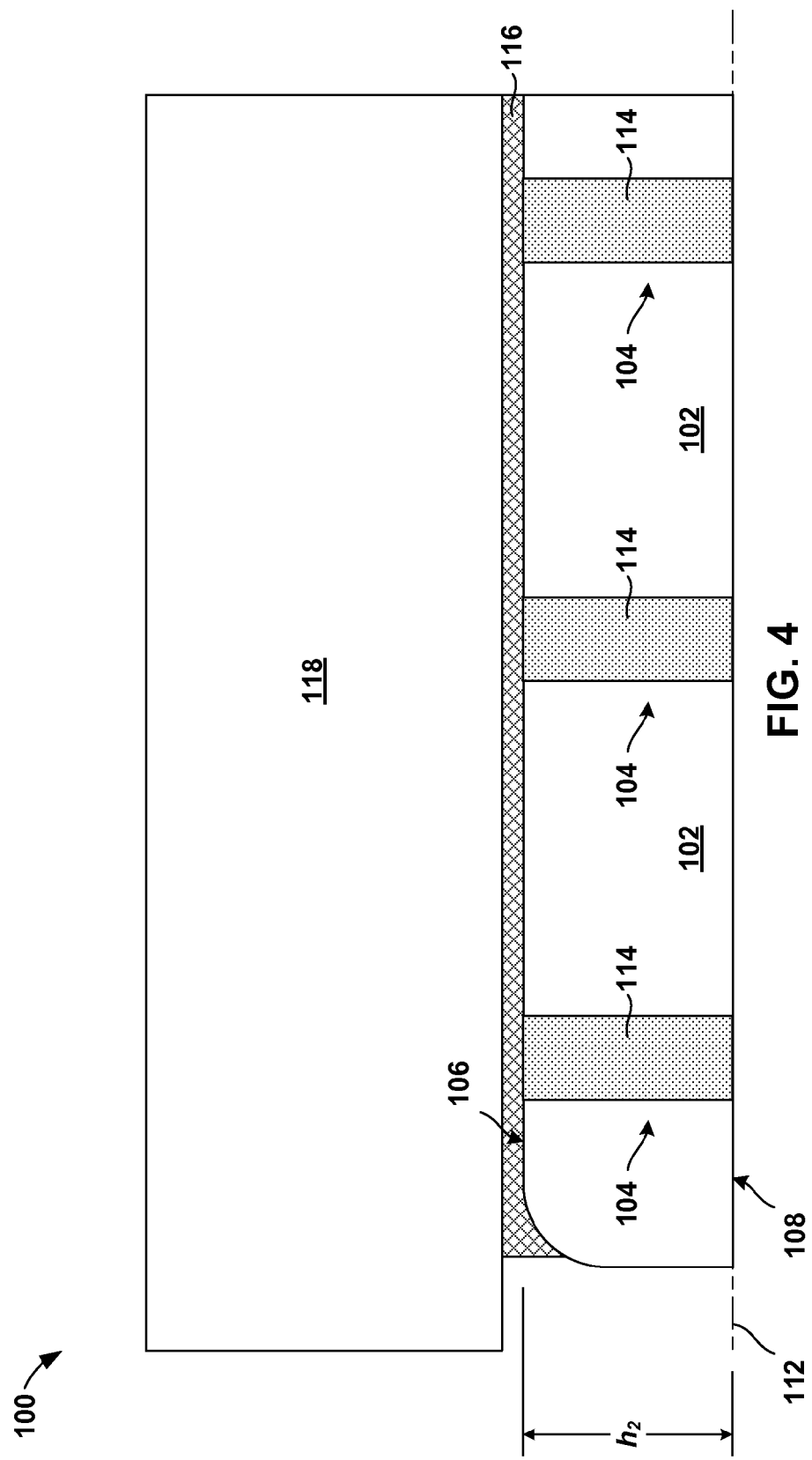

Referring now to FIG. 4, an adhesive 116 may be used to attach a handler 118 to the front side 106 of the wafer 102 according to techniques well known in the art. The adhesive 116 may include a solvent based adhesive, a UV sensitive adhesive or a temperature sensitive adhesive. Next, the wafer 102 thickness may be reduced or thinned using backside grinding techniques also well known in the art, as above. The chosen grinding technique may preferably reduce the thickness of the wafer 102 from the total thickness ($h_1$) (FIG. 3) to the desired final thickness ($h_2$). In doing so, the fill material 114 may be exposed on the back side 108 of the wafer 102. Therefore, the plurality of dicing channels 104 may, now after backside grinding, extend from the front side 106 of the wafer 102 to the back side 108 of the wafer 102. Typically, in cases in which the plurality of dicing channels 104 are not filled with the fill material 114, they would otherwise be filled with the adhesive 116 used to attach the handler 118 to the front side 106 of the wafer 102. In an alternate embodiment, a backside tape (not shown) may be applied to the front side 106 of the wafer 102, instead of the adhesive 116 and handle wafer 118, to ensure against wafer surface damage and contamination during the backside grind technique.

Figure 5:
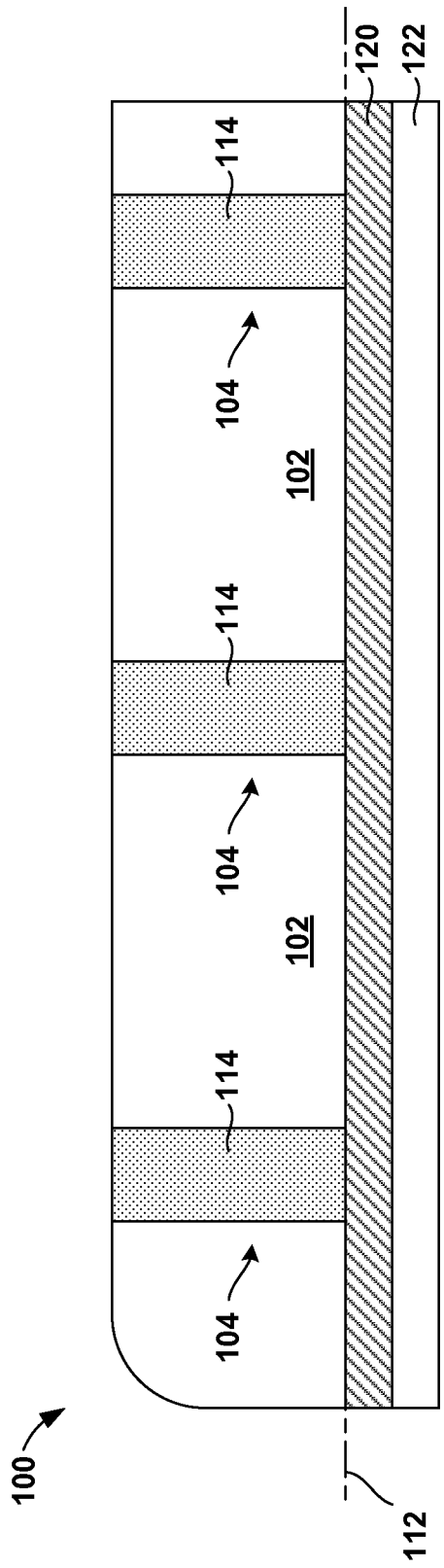

Referring now to FIG. 5, a metal layer 120 may be deposited on the back side 108 of the wafer 102. In one embodiment, the metal layer 120 may be used as a ground plane. The metal layer may include Ti, TiN, Cu, Cr, Au, or any alloy thereof, and may be deposited using any deposition technique known in the art, such as, for example, sputter deposition, evaporation, or chemical vapor deposition. In one embodiment, the metal layer 120 may include Ti/Cu/Ti/Au deposited using a sputter deposition technique. The metal layer 120 may include a thickness ranging from about 10 nm to about 1000 nm. Typically, in cases in which the plurality of dicing channels 104 are not filled with the fill material 114, the metal layer 120 would directly contact the adhesive 116 within the plurality of dicing channels 104. Direct contact between the adhesive 116 and the metal layer 120 is undesirable and contamination of the metal layer 120 may occur. Outgasing of the adhesive during deposition of the metal layer 120 and processing, due to its relatively low thermal stability, may contaminate the metal layer 120 and negatively affect adhesion of the metal layer 120 to the back side 108 of the wafer 102, in turn affecting chip yield and performance.

Next, in one embodiment, a backside tape 122 maybe applied directly to the metal layer 120. The backside tape 122 may be applied primarily to hold or secure the individual chips 110 during the remainder of the dicing technique as they are individually separated from one another.

The adhesive 116 (FIG. 4) may then be deactivated and both the adhesive 116 (FIG. 4) and the handler 118 (FIG. 4) may be removed from the front side 106 of the wafer 102. Deactivation of the adhesive may depend on the respective adhesive chosen to attach the handler 118 to the front side 106 of the wafer 102, and is generally well known in the art. In embodiments in which a solvent based adhesive is use, the adhesive may be deactivated with the proper solvent. In embodiment in which a UV sensitive adhesive is used, exposure to UV light may deactivate the adhesive and release the handler 118 form the front side 106 of the wafer 102. In embodiments in which a temperature sensitive adhesive is used, generally, exposure to heat may deactivate the adhesive.

Referring now to FIG. 6, the fill material 114 within the plurality of dicing channels 104 may be removed using any suitable technique known in the art. The suitable technique may remove the fill material 114 selective to the surrounding features, such as, for example, the wafer 102, the metal layer 120, and the bond pads (not shown) located on the surface of the chips 110. In one embodiment, a wet clean technique using dilute hydrofluoric acid may be used to remove the fill material 114 from within the plurality of dicing channels 104. It should be noted that removal of the fill material 114 may preferably expose the metal layer 120 at the bottom of the plurality of dicing channels 104.

Next, a portion of the metal layer 120 may be removed from the bottom of the dicing channels 104. Any suitable etching technique known in the art may be used to remove the portion of the metal layer 120 at the bottom of the plurality of dicing channels 104. At this point in the fabrication process of the present example, the metal layer 120 may be the only physical structure holding the multiple chips (e.g. 110) together. By removing the portion of the metal layer 120 from the bottom of the dicing channels 104, each individual chip 110 may be mechanically separated from one another, while the backside tape 122 remains to hold the chips 110 in some uniform pattern. In one embodiment, a wet etch technique, such as, for example, acid etches based on $H_2SO_4$, $HNO_3$ or HCl, may be used to remove the portion of the metal layer 120 located at the bottom of the plurality of dicing channels 104, selective to the wafer 102 and the backside tape 122. It should be noted that the chosen etching technique used to remove the portion of the metal layer 120 may result in an undercut 124. The undercut 124 may consist of some amount of the metal layer 120 being removed from directly below the wafer 102 adjacent to the plurality of dicing channels 104.

Figure 7A:
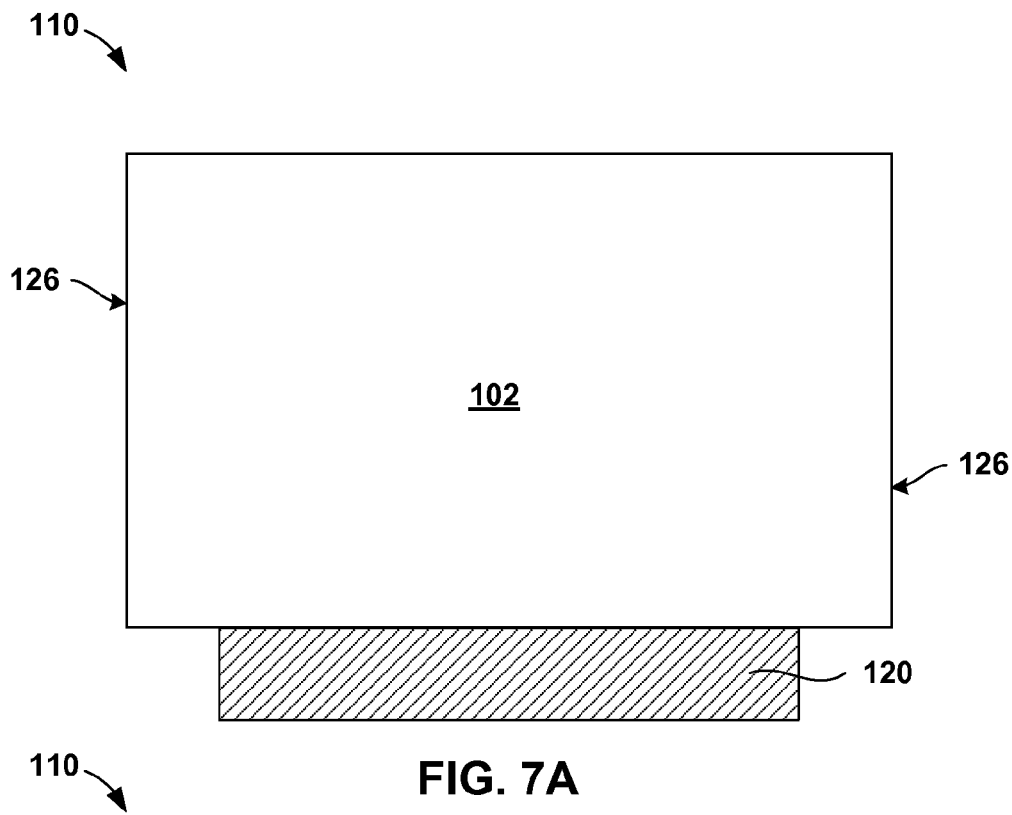
FIG. 7A is a cross section view of a single chip after dicing according to an exemplary embodiment.
Figure 7B:
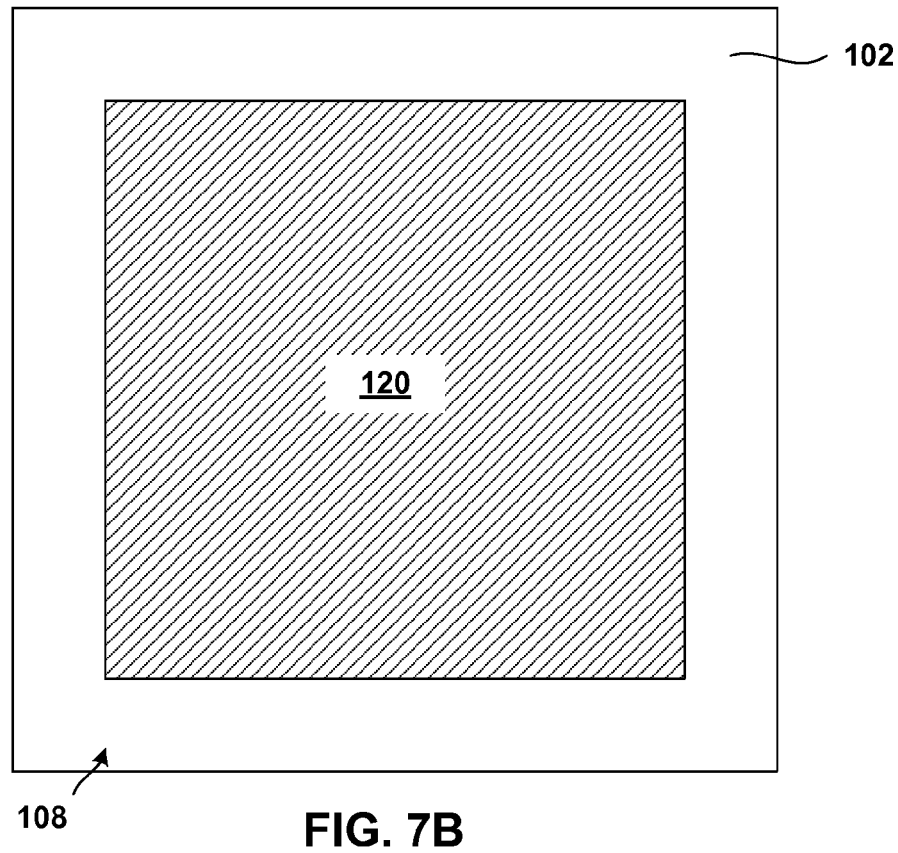
FIG. 7B is a bottom view of FIG. 7A according to an exemplary embodiment.

Referring now to FIGS. 7A and 7B, an individual chip 110 after dicing is shown. After removing the portion of the metal layer 120 from the bottom of the plurality of dicing channels individual chips (e.g. 110) may be removed from the backside tape 122 (FIG. 6). The individual chip 110 may include a portion of the wafer 102, and a portion of the metal layer 120. As detailed above the portion of the metal layer 120 may be undercut (e.g. 124) exposing a portion of the back side 108 of the wafer 102. Similarly, the edges of the portion of the metal layer 120 may be offset from the edges 126 of the individual chip 110 such that an overall size or footprint of the portion of the metal layer 120 is smaller than an overall size or footprint of the individual chip 110, as illustrated in FIG. 7B. Similarly, the offset between the edges of the metal layer 120 and the edges 126 of the chip 110 may correspond to the undercut 124 illustrated in FIG. 6.

According to the present embodiment, the edges 126 of the individual chip 110 formed by the partial dicing technique, described above, may have a noticeably rough surface relative to etched surfaces. In the present embodiment, the entire edge 126, extending from the front side 106 of the wafer 102 to the back side 108 of the wafer 102 may have the noticeably rough surface.

Another embodiment by which to prevent the contamination of the metal layer is described in detail below by referring to the accompanying drawings FIGS. 8-14. In the present embodiment, the dicing channels are formed to a depth less than a desired final thickness of the wafer after being thinned. More, specifically, the adhesive which typically fills the plurality of dicing channels may not be in direct contact with the metal layer, and as such the metal layer may not be contaminated by the adhesive as it outgases during processing. Like above, FIGS. 8-12 each represent a cross section view of FIG. 1A along section line A-A. In the present embodiment, a structure 200 is shown. The structure 200 may include the wafer 102 having a plurality of dicing channels 128.

Referring now to FIG. 8, the plurality of dicing channels 128 are substantially similar to those described above; however, the plurality of dicing channels 128 may be formed to a different depth than the plurality of dicing channels 104 described above. Like above, the wafer 102 may have a total thickness ($h_1$) ranging from about 705 μm to about 745 μm, and a desired final thickness ($h_2$) ranging from about 90 μm to about 110 μm, the total thickness ($h_1$) may be measured before backside grinding and the desired final thickness ($h_2$) may be measured after backside grinding. Also, the desired final thickness ($h_2$) may be indicated in the figures by a reference plane 112. The wafer 102 may undergo the subsequent backside grinding technique according to description above.

In the present embodiment, the dicing channels 128 may extend from the front side 106 of the wafer 102 to a depth (d) above the reference plane 112, or to a depth (d) less than the desired final thickness ($h_2$). The dicing technique of the present embodiment may also be referred to as a partial dicing technique because the dicing channels do not extend through the total thickness ($h_1$) of the wafer 102. In one embodiment, the depth (d) of the plurality of dicing channels may range from about 30 μm to about 80 μm, but in any instance less than the desired final thickness ($h_2$).

Figure 9:
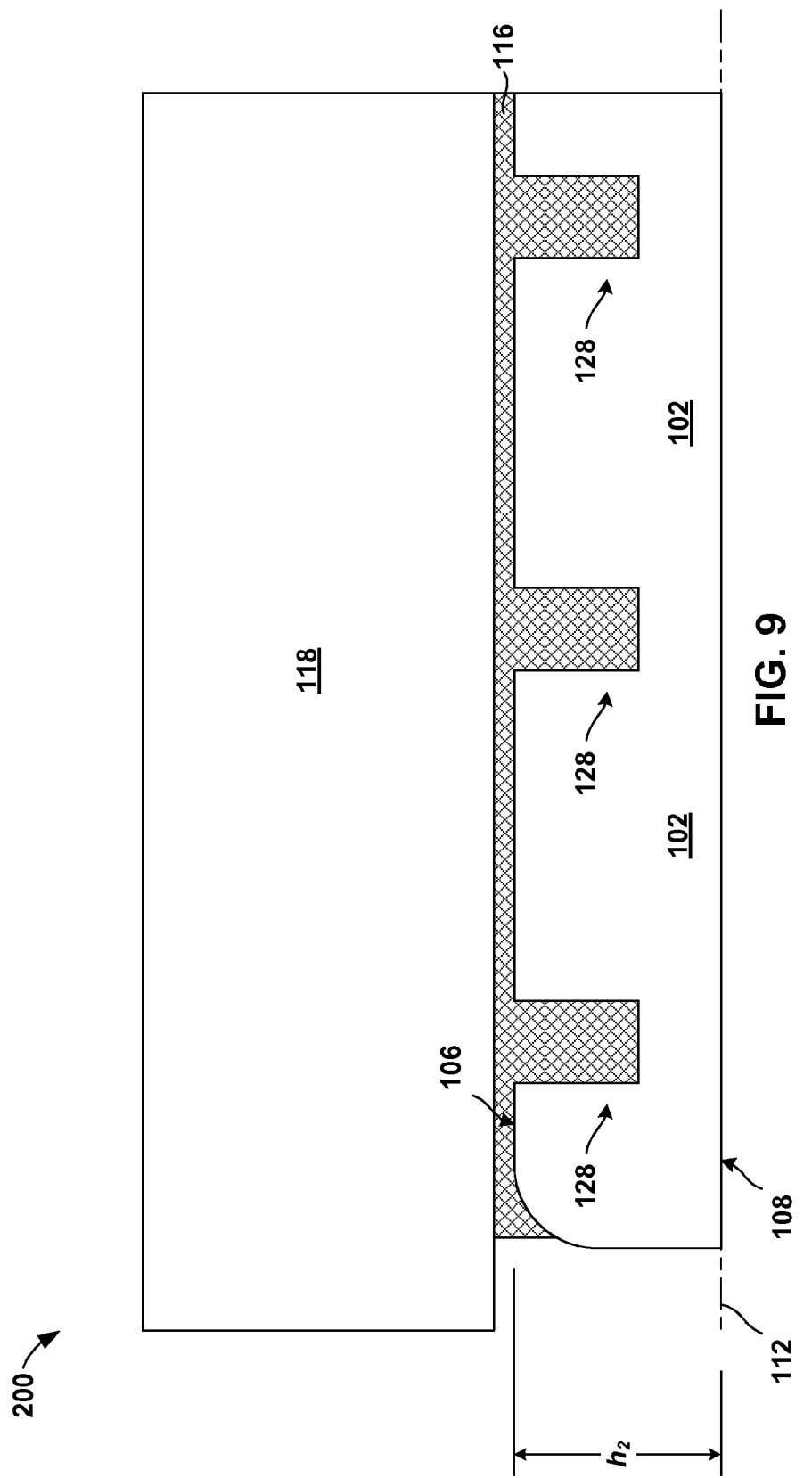

Referring now to FIG. 9, the adhesive 116 may be used to attach the handler 118 to the front side 106 of the wafer 102 according to techniques well known in the art. It should be noted that the adhesive 116 may partially occupy or substantially fill the plurality of dicing channels 128 during attachment of the handler 118. Next, like above, the wafer 102 thickness may be reduced or thinned using a backside grinding technique known in the art. The chosen grinding technique may preferably reduce the thickness of the wafer 102 from the total thickness ($h_1$) (FIG. 8) to the desired final thickness ($h_2$). In doing so, neither the bottom of the plurality of dicing channels 128 nor the adhesive 116 will be exposed by the backside grinding technique. Therefore, after backside grinding, the plurality of dicing channels 128 may partially extend into the wafer 102 from the front side 106 of the wafer 102.

Figure 10:
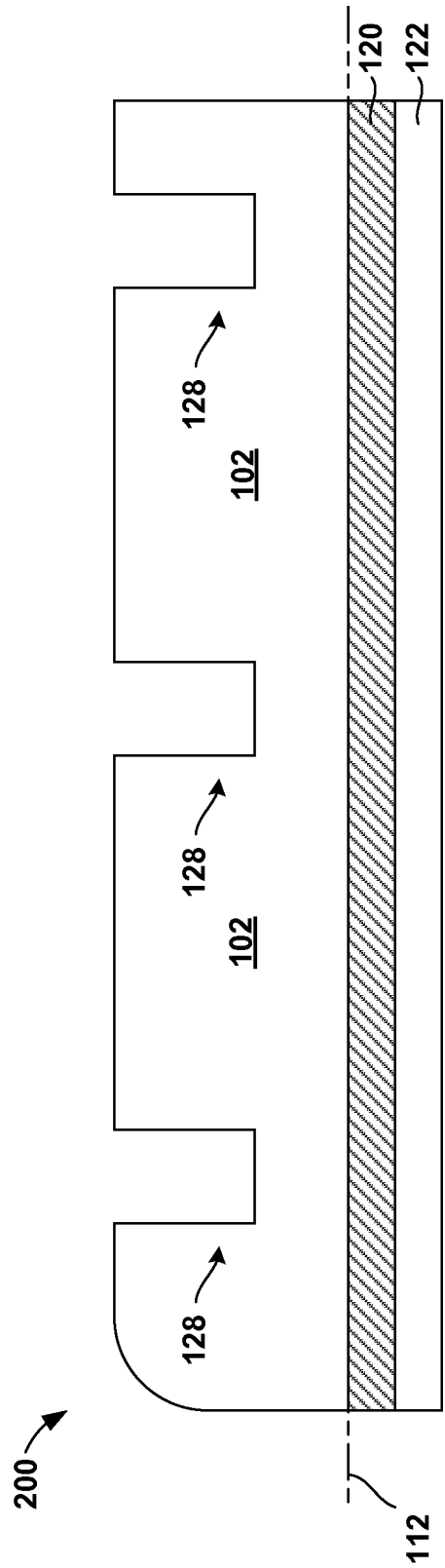

Referring now to FIG. 10, the metal layer 120 may be deposited on the back side 108 of the wafer 102, as described above. In one embodiment, as shown, the backside tape 122 maybe applied directly to the metal layer 120. Lastly, the adhesive 116 (FIG. 9) may then be deactivated and both the adhesive 116 (FIG. 9) and the handler 118 (FIG. 9) may be removed from the front side 106 of the wafer 102, as described above.

Figure 11:
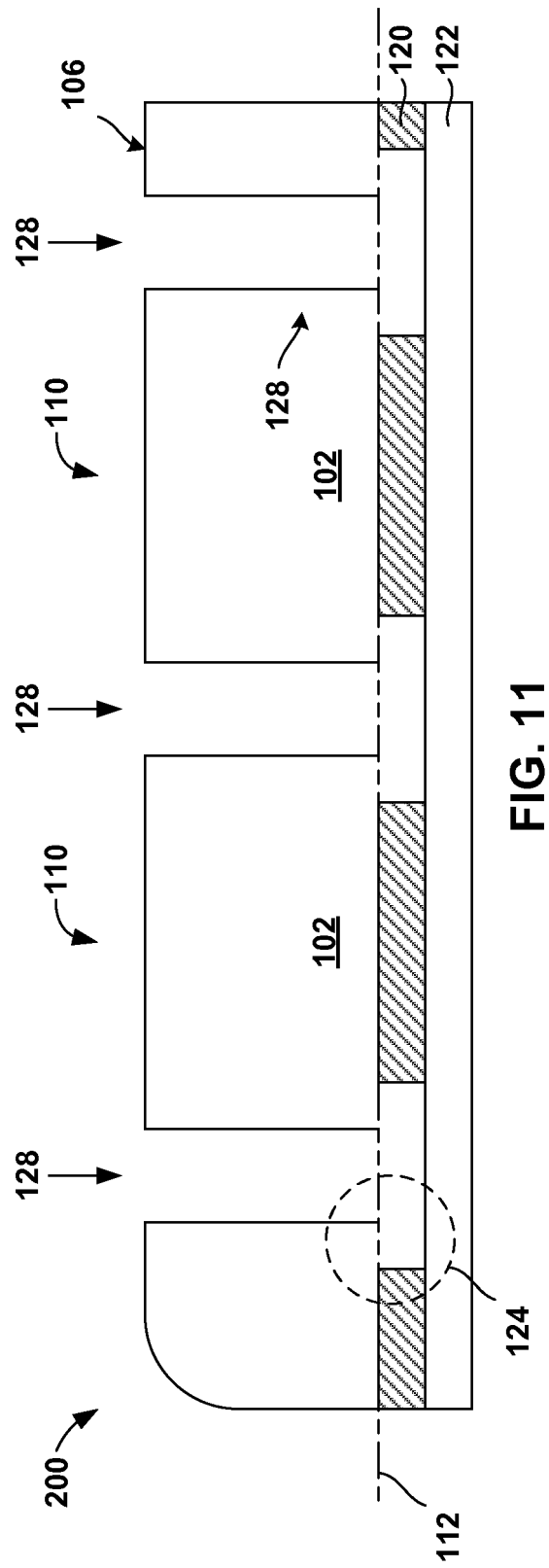

Referring now to FIG. 11, the plurality of dicing channels 128 may be etched deeper using any suitable etching technique known in the art. A suitable etching technique may etch the wafer 102 selective to and stopping on the metal layer 120. In one embodiment, a wet etching technique (based on KOH alkaline solution), or a reactive ion etching technique (Fluorine-based chemistry) may be used to deepen the plurality of dicing channels 128 and expose the metal layer 120.

Next, once the metal layer 120 is exposed, a portion of the metal layer 120 may be removed from a bottom of the plurality of dicing channels 128. The portion of the metal layer 120 may be etched in accordance with the description above with reference to FIG. 6 Like above, the chosen etching technique may physically separate individual chips (e.g. 110) and result in the undercut 124.

Figure 12A:
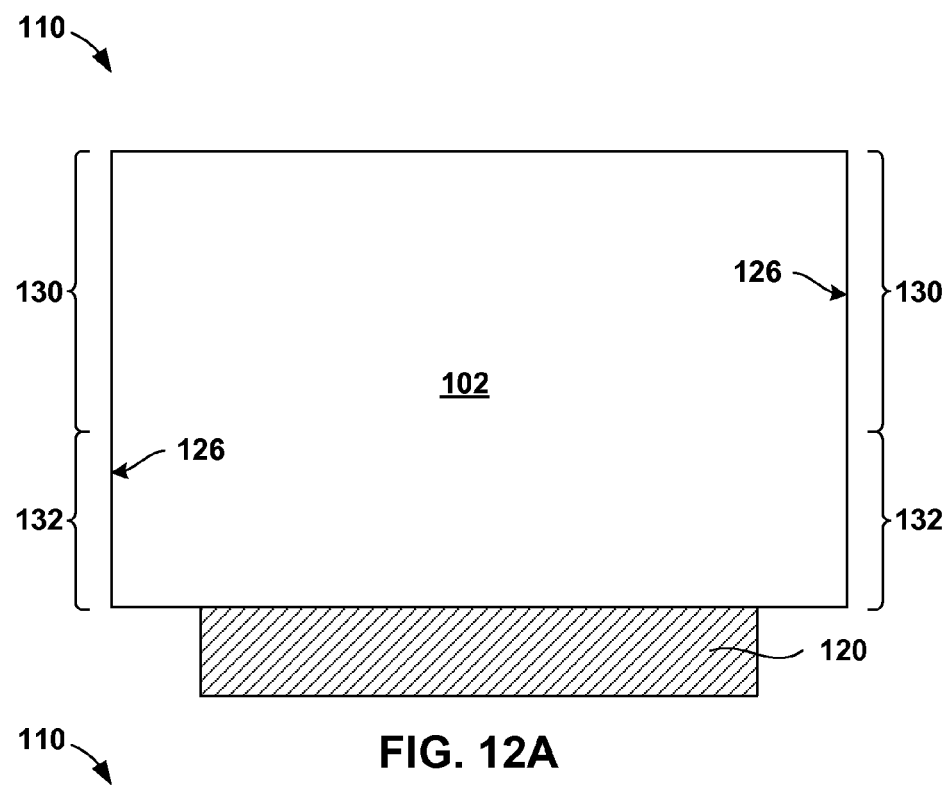
FIG. 12A is a cross section view illustrating a single chip after dicing according to an exemplary embodiment.
Figure 12B:
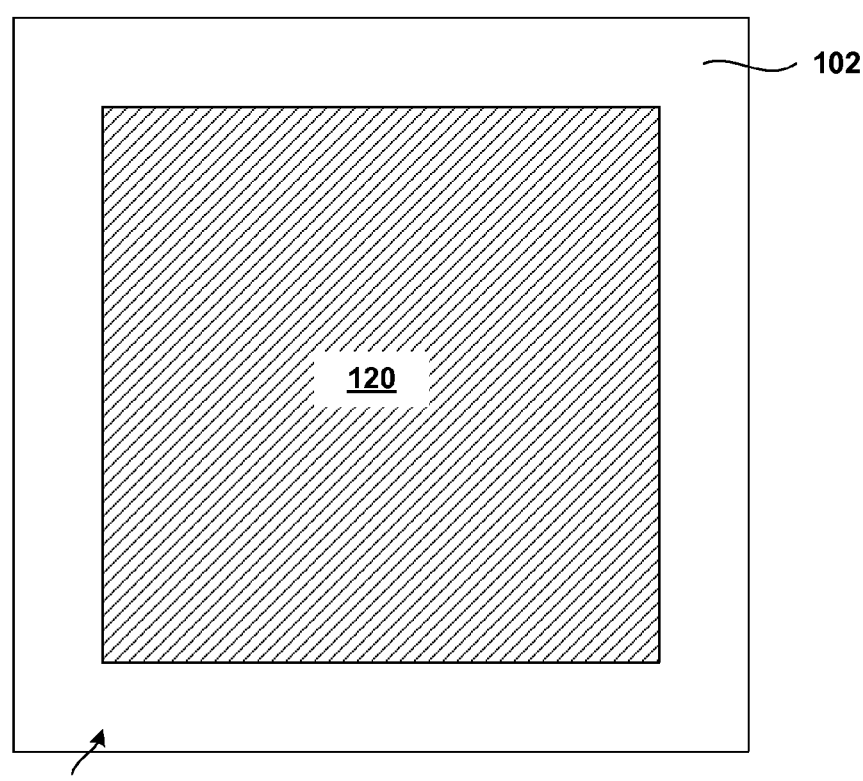
FIG. 12B is a bottom view of FIG. 12A according to an exemplary embodiment.

Referring now to FIGS. 12A and 12B, the individual chip 110 is shown, like above. According to the present embodiment, an upper portion of the edges 126 of the individual chip 110 formed by the partial dicing technique may have a noticeably rough surface relative to an etched surface. The noticeably rough portion of the edges 126 may be a direct result of the partial dicing technique described above, and is indicated in the figure by the reference numeral 130. Conversely, the edges 126 of the present embodiment may also have a noticeably smooth portion relative to a diced surface. The noticeably smooth portion of the edges 126 may be a direct result of the etching technique used to expose the metal layer 120, and is indicated in the figure by the reference numeral 132.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a plurality of dicing channels in a front side of a wafer, the plurality of dicing channels comprising a depth at least greater than a desired final thickness of the wafer;
   filling the plurality of dicing channels with a fill material;
   removing a portion of the wafer from a back side of the wafer until the desired final thickness is achieved, wherein a portion of the fill material within the plurality of dicing channels is exposed on the back side of the wafer;
   depositing a continuous metal layer on the back side of the wafer;
   removing the fill material from within the plurality of dicing channels to expose the metal layer at a bottom of the plurality of dicing channels, the fill material is removed from the front side of the wafer; and
   removing, from the front side of the wafer, a portion of the metal layer located at the bottom of the plurality of dicing channels.

2. The method of claim 1, further comprising:
   applying a backside tape to the metal layer on the back side of the wafer.

3. The method of claim 1, further comprising:

attaching a handler to the front side of the wafer.

4. The method of claim 1, wherein filling the plurality of device channels with the fill material comprises:

filling the plurality of device channels with an inorganic material.

5. The method of claim 1, wherein filling the plurality of device channels with the fill material comprises:

filling the plurality of device channels with silicon, germanium, or spin-on-glass.

6. The method of claim 1, wherein filling the plurality of device channels with the fill material comprises:

filling the plurality of device channels using a spin on technique.

7. The method of claim 1, wherein forming a plurality of dicing channels in the front side of a wafer comprises:

using a saw blade, chemicals, a laser, or some combination thereof.

8. The method of claim 1, wherein the metal layer comprises Ti, TiN, Cu, Cr, Au or any alloy thereof.

9. The method of claim 1, wherein removing a portion of the wafer from the back side of the wafer until the desired final thickness is achieved comprises:

using a backside grinding technique.

10. A method comprising:

forming a plurality of dicing channels in a front side of a wafer; the plurality of dicing channels comprising a depth at least less than a desired final thickness of the wafer;

removing a portion of the wafer from a back side of the wafer until the desired final thickness is achieved;

depositing a continuous metal layer on the back side of the wafer;

etching a bottom of the plurality of dicing channels from the front side of the wafer to expose the metal layer; and removing a portion of the metal layer located at the bottom of the plurality of dicing channels.

11. The method of claim 10, further comprising:
attaching a handler to the front side of the wafer.

12. The method of claim 10, further comprising:

applying a backside tape to the metal layer on the back side of the wafer.

13. The method of claim 10, wherein forming a plurality of dicing channels in a front side of a wafer comprises:

using a saw blade, chemicals, a laser, or some combination thereof.

14. The method of claim 10, wherein the metal layer comprises Ti, TiN, Cu, Cr, Au, or any alloy thereof.

15. The method of claim 10, wherein removing a portion of the wafer from the back side of the wafer until the desired final thickness is achieved comprises:

using a backside grinding technique.

\* \* \* \* \*